United States Patent
Tailliet

(10) Patent No.: US 11,244,941 B2
(45) Date of Patent: Feb. 8, 2022

(54) INTEGRATED DEVICE FOR PROTECTION FROM ELECTROSTATIC DISCHARGES

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/877,935

(22) Filed: May 19, 2020

(65) Prior Publication Data

US 2020/0373295 A1 Nov. 26, 2020

(30) Foreign Application Priority Data

May 22, 2019 (FR) ........................................ 1905367

(51) Int. Cl.
*H01L 27/02* (2006.01)
*H01L 23/50* (2006.01)

(52) U.S. Cl.
CPC .......... *H01L 27/0292* (2013.01); *H01L 23/50* (2013.01)

(58) Field of Classification Search
CPC . H01L 27/0292; H01L 23/50; H01L 23/5286; H01L 27/0248; H01L 27/0259; H01L 27/0296
USPC .......................................................... 361/56
See application file for complete search history.

(56) References Cited

U.S. PATENT DOCUMENTS

| 5,821,804 A * | 10/1998 | Nikutta ............... H01L 27/0251 327/382 |
| 6,144,542 A * | 11/2000 | Ker ...................... H01L 27/0251 361/111 |
| 7,072,157 B2 * | 7/2006 | Kitagawa ............ H01L 27/0251 361/111 |
| 7,541,840 B2 * | 6/2009 | Jeon ...................... H01L 27/027 326/83 |
| 9,812,437 B2 * | 11/2017 | Kakubari ............ H01L 27/0292 |
| 2005/0152081 A1 | 7/2005 | Worley |

(Continued)

FOREIGN PATENT DOCUMENTS

EP 3340298 A1 6/2018

OTHER PUBLICATIONS

De Radd; Dec. 18, 2017; Electrostatic discharge protection for use with an internal floating ESD rail; specification, drawings (Year: 2017).*

(Continued)

*Primary Examiner* — Dharti H Patel
(74) *Attorney, Agent, or Firm* — Crowe & Dunlevy

(57) ABSTRACT

A first power supply rail is provided as a power supply tree configured with couplings to distribute a supply voltage to active elements of the circuit. A second power supply rail is provided as an electrostatic discharge channel and is not configured with distribution tree couplings to active elements of the circuit. A first electrostatic discharge circuit is directly electrically connected between one end of the second power supply rail and a ground rail. A second electrostatic discharge circuit is directly electrically connected between an interconnect node and the ground rail. The interconnect node electrically interconnects another end of the second power supply rail to the first power supply rail at the second electrostatic discharge circuit.

8 Claims, 1 Drawing Sheet

(56) References Cited

U.S. PATENT DOCUMENTS

2010/0165524 A1* 7/2010 Lim .................... H01L 27/0251
 361/56

OTHER PUBLICATIONS

INPI Search Report and Written Opinion for FR 1905367 dated Jan. 21, 2020 (8 pages).

* cited by examiner

INTEGRATED DEVICE FOR PROTECTION FROM ELECTROSTATIC DISCHARGES

PRIORITY CLAIM

This application claims the priority benefit of French Application for Patent No. 1905367, filed on May 22, 2019, the content of which is hereby incorporated by reference in its entirety to the maximum extent allowable by law.

TECHNICAL FIELD

Embodiments relate to integrated circuits and, in particular, to devices for protection from electrostatic discharges in integrated circuits.

BACKGROUND

The circuitry for protecting integrated circuits from electrostatic discharges (ESDs) is subject to large currents, typically of several amps, inside the circuit.

These large currents have to flow through the interior of the chip via specific pathways, between the terminals receiving the discharge.

As a general rule, the paths comprise dedicated protection components connected to power supply rails, configured to clip the electrostatic discharge, through which the discharge current will flow.

The power supply rails are conventionally formed by metal tracks, in the interconnect levels of the integrated circuit (BEOL, for back end of line), and distribute the supply and reference voltages to the active components at various points on the integrated circuit.

Conventionally, the active components may be connected at any point on the power supply rails, and are capable of withstanding a specified maximum voltage before being destroyed. Active components are particularly sensitive to overvoltages in the supply voltage.

Because of ohmic voltage drop, the voltage on the power supply rails during an electrostatic discharge is equal to the voltage across the terminals of the dedicated protection components added to the voltage generated by the flow of the discharge current against the resistance of the power supply rails.

Thus, it is common for the voltage at one end of a power supply rail to be higher than the destructive maximum voltage, and it is likely that the voltage at a point on the power supply rail to which an active component is connected, equivalent to a voltage divider bridge, is also higher than the destructive maximum voltage.

Decreasing the resistance of the rails by increasing their width has been proposed, but this results in detrimental bulk.

Adjusting the protection components to decrease the voltage across the terminals, besides being technically difficult and expensive, is restricted by a trade-off between the supply voltage and the destructive maximum voltage.

Multiplying the number of protection components typically leads to random and difficult-to-control behaviors.

Thus, it is desirable to decrease the risk of a fault in the protection for integrated circuits from electrostatic discharges (ESDs).

SUMMARY

According to embodiments, what is proposed is a simple and inexpensive device that makes it possible to completely remove the risk of a fault in the protection for integrated circuits from electrostatic discharges, which device exhibits decreased bulk and improved performance, in particular in terms of predictability.

According to one aspect, an integrated circuit includes a first power supply rail that is configured to distribute a supply voltage to active elements of the integrated circuit, and a device for protection from electrostatic discharges comprising a second power supply rail that is configured to channel an electrostatic discharge current between a power supply pin and a ground pin, the second power supply rail not being connected to any active element of the circuit.

Thus, in the event of an electrostatic discharge, the discharge current flows through the second power supply rail. Since the second power supply rail is not connected to any active element of the circuit, the ohmic voltage drop does not introduce a voltage that is higher than the destructive maximum voltage into any active element of the circuit.

The device for protection from electrostatic discharges according to this aspect does not require the second power supply rail to exhibit very low resistivity, and may therefore use a smaller area than conventional devices.

Because of the simplicity of the structure of the protection device, the behavior of the device is readily foreseeable and may easily be designed optimally.

According to one embodiment, the device for protection from electrostatic discharges comprises a first electrostatic discharge clipping device having a terminal that is directly connected to the ground terminal and an input terminal, and the second power supply rail is connected to the power supply pin and to said input terminal of the first discharge clipping device.

Advantageously, the first power supply rail is connected to the power supply pin via the second power supply rail over said input terminal of the first electrostatic discharge clipping device.

Consequently, during an electrostatic discharge, the voltage in the power supply distribution tree is determined by the voltage on said input terminal, and this voltage is characterized by the first electrostatic discharge clipping device. The electrostatic discharge clipping device is, for example, provided with thyristors and transistors using reliable and well-established technologies.

According to one embodiment, the integrated circuit includes a ground distribution tree, connected to the ground pin, that is configured to distribute a ground voltage to active elements of the circuit, and the device for protection from electrostatic discharges comprises a second electrostatic discharge clipping device that is directly connected to the power supply pin and to a point on the ground distribution tree.

The second clipping device is advantageously connected to the point on the ground distribution tree that is closest to the power supply pin.

The second clipping device makes it possible, in particular, for the discharge current to be distributed from the power supply pin to the ground pin by channeling it simultaneously through the second power supply rail and through the ground distribution tree. This allows the width of the second power supply rail to be decreased, and makes it possible to avoid the risk of a fuse-like rupture caused by the entirety of the discharge current flowing through the second power supply rail.

According to one embodiment, the integrated circuit further includes at least one input-output pin, and the device for protection from electrostatic discharges comprises at least a third electrostatic discharge clipping device that is directly connected, respectively, to each input-output pin and to a respective point on the ground distribution tree.

This embodiment makes it possible, in particular, to avoid an increase in the voltage in the first power supply rail in the event of a positive electrostatic discharge from the power supply pin to an input-output pin. Specifically, the increase in the voltages that would be caused by ohmic drop on the ground distribution tree (the discharge current flowing through the ground distribution tree to reach the input-output pin, after having travelled through the second power supply rail) would be passed on to the ground pin and to the first power supply rail.

However, said at least a third discharge clipping device allows the discharge current to travel through a more direct resistive pathway between the power supply pin and the input-output pin, thereby avoiding a harmful increase in the voltages by ohmic drop.

This embodiment advantageously applies to the input-output terminals that are closer to the power supply pin than to the ground pin.

For example, the integrated circuit comprises a chip produced on a semiconductor substrate and incorporating the active elements of the circuit, and an interconnect portion comprising metal levels incorporating said power supply rails, said pins and the ground distribution tree.

BRIEF DESCRIPTION OF THE DRAWINGS

Other advantages and features will become apparent upon examining the detailed description of completely non-limiting embodiments and the appended drawings, in which.

DETAILED DESCRIPTION

Figure 1:
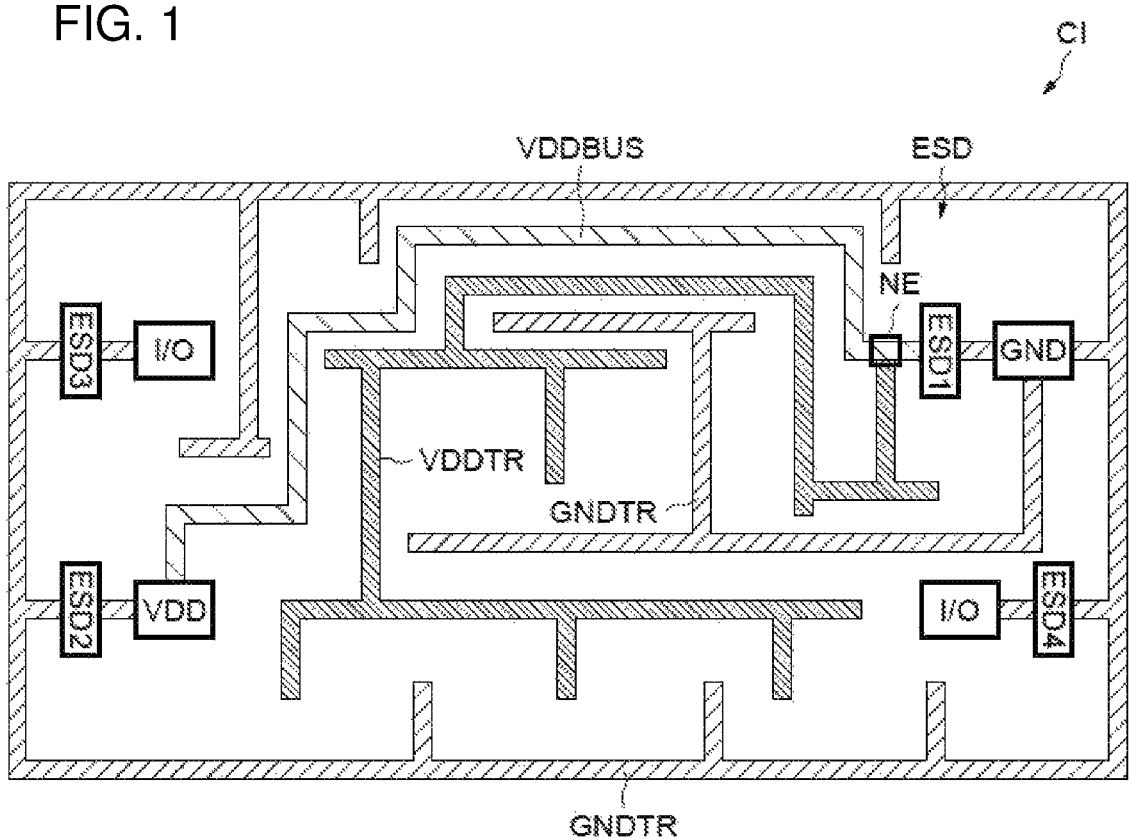
FIG. 1 illustrates an example of metal tracks of a metal level in the back end of line BEOL interconnect levels of an integrated circuit.

FIG. 1 illustrates an example of metal tracks of a metal level in the BEOL interconnect levels of an integrated circuit CI. The acronym BEOL stands for back end of line.

The integrated circuit CI also comprises a chip (not shown) produced on the basis of a semiconductor substrate and incorporating active elements of the circuit CI in a region that is typically referred to using the acronym FEOL, for front end of line.

The interconnect portion of the integrated circuit CI includes pins that are intended for contact outside the integrated circuit, in particular a power supply pin VDD that is intended to receive a supply voltage, for example 5 V, and a ground pin GND that is intended to receive a reference voltage.

The integrated circuit CI includes a first power supply rail VDDTR that is configured as a distribution tree for distributing the supply voltage to the active components that are located at various points in the chip through various tree couplings. The first power supply rail VDDTR is formed by metal tracks in one or more metal levels of the interconnect portion of the integrated circuit CI.

Similarly, a ground distribution tree GNDTR is coupled to the active elements at various points Gi in the chip and is formed by metal tracks in one or more metal levels of the interconnect portion of the integrated circuit CI, and is configured as a distribution tree for distributing the ground voltage to the active components that are located at various points in the chip through various tree couplings.

In this example, the integrated circuit CI further includes two input-output pins I/O, which are intended to route input and/or output signals.

In this depiction, the pins VDD, GND, I/O are shown as solder pads in a metal level. After encapsulation, these solder pads will be electrically connected to actual external pins, which are typically intended to be connected to an external device.

The external pins may come into contact with elements holding an electrostatic charge, for example the fingers of an operator handling the integrated circuit CI. The electrostatic charge may be higher than a destructive maximum voltage, beyond which the active components of the integrated circuit CI are destroyed.

The integrated circuit CI includes a device ESD for protection from electrostatic discharges, which is configured to exhibit a voltage that is as low as possible between two pins receiving an electrostatic discharge such that the energy of the discharge is dissipated by the source of the electrostatic discharge.

Typically, the human body model (HBM), which is conventional and known per se, is used as a reference impedance that must be able to dissipate the energy of the discharge.

To this end, the device ESD for protection from electrostatic discharges includes electrostatic discharge clipping devices ESD1, ESD2, ESD3, ESD4 ("ESDi") that are associated with each of the pins VDD, GND, I/O.

The electrostatic discharge clipping devices ESDi are directly connected to the respective pin, i.e., as close as possible and without any other element being coupled between them.

Following arbitrary numbering, the first electrostatic discharge clipping device ESD1 is that which is directly connected to the ground pin GND.

The electrostatic discharge clipping devices ESDi conventionally comprise a semiconductor assembly, for example thyristors, that is configured to exhibit high impedance ("open circuit") while the voltage between two terminals is lower than a trigger voltage, also referred to as a firing voltage, and negligible impedance ("short circuit") if the voltage between the two terminals has exceeded the trigger voltage. The term "negligible impedance" is understood to mean an impedance that is negligible with respect to the impedance of the human body model (HBM).

The device ESD for protection from electrostatic discharges further includes a second power supply rail VDDBUS that connects the power supply pin VDD to a terminal of the first electrostatic discharge clipping device ESD1.

The second power supply rail VDDBUS is, for example, formed by a metal track in one or more metal levels of the interconnect portion of the integrated circuit CI.

The second power supply rail VDDBUS is not connected to any active element of the chip of the integrated circuit CI between the power supply pin VDD and said input terminal of the first discharge clipping device ESD1 (i.e., this bus is not configured as a distribution tree thus does not include any tree couplings for distributing the supply voltage to the active components that are located at various points in the chip).

Additionally, to distribute the supply voltage to the active elements of the chip, the first power supply rail VDDTR is connected to the power supply pin VDD, that receives the supply voltage, via the second power supply rail VDDBUS. The first power supply rail VDDTR is thus connected to said input terminal NE of the first electrostatic discharge clipping device ESD1.

The metal tracks of the first power supply rail VDDTR are configured to route the supply voltage from the input terminal NE to the active elements that are located at various points Vi in the chip.

Furthermore, the device ESD for protection from electrostatic discharges comprises the second electrostatic discharge clipping device ESD2 that is directly connected to the power supply pin VDD and to a point on the ground distribution tree GNDTR. Advantageously, the point on the ground distribution tree GNDTR is chosen to be as close as possible to the power supply pin VDD.

The third electrostatic discharge clipping devices ESD3, ESD4 are directly connected, respectively, to each input-output pin I/O and to a respective point on the ground distribution tree GNDTR.

Figure 2:
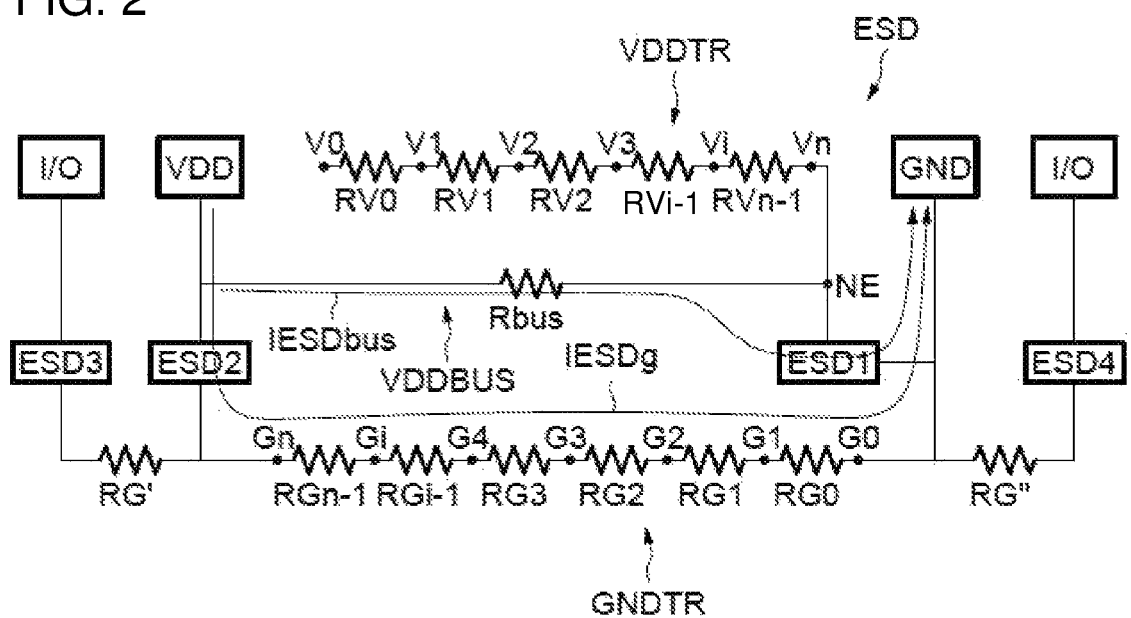
FIG. 2 shows, in the form of a circuit diagram, the metal tracks described above with reference to FIG. 1.

Reference is now made to FIG. 2.

FIG. 2 shows, in the form of a circuit diagram, the metal tracks described above with reference to FIG. 1.

The resistances RVi, where $0 \le i \le n-1$, represent the intrinsic resistances of the metal tracks of the distribution tree of the first power supply rail VDDTR between two points Vi and Vi+1, where $0 \le i \le n-1$, to which the active elements of the chip are coupled.

The resistances RGi, where $0 \le i \le n-1$, represent the intrinsic resistances of the metal tracks of the ground distribution tree GNDTR between two points Gi and Gi+1, where $0 \le i \le n-1$, to which the active elements of the chip are coupled.

The resistances RG' and RG" represent, respectively, the intrinsic resistance of the metal tracks of the ground distribution tree GNDTR between the power supply pin VDD and the input-output pin I/O that is next to it and, respectively, between the ground pin GND and the input-output pin I/O that is next to it.

The resistance Rbus represents the intrinsic resistance of the metal track of the second power supply rail VDDBUS that connects the power supply pin VDD and the input terminal NE of the first electrostatic discharge clipping device ESD1.

Thus, in the event of an electrostatic discharge between the power supply pin VDD and the ground pin GND, the discharge current IESDbus travels through the second power supply rail VDDBUS. Additionally, since the second power supply rail VDDBUS is not connected to any active element of the chip at a point Vi, the ohmic voltage drop in the second rail VDDBUS does not introduce a voltage that is higher than the destructive maximum voltage into the active elements of the chip.

Conversely, during the electrostatic discharge, the voltage in the power supply distribution tree VDDTR is determined by the voltage on said input terminal NE, and this voltage is dictated by the design of the first electrostatic discharge clipping device ESD1.

Techniques that are conventional and known per se allow the first electrostatic discharge clipping device ESD1 to be configured such that, in the on state, the voltage on the input terminal NE is lower than the destructive maximum voltage specified for the active elements.

A parallel discharge current IESDg travels through the ground distribution tree GNDTR via the second and first discharge clipping devices ESD2, ESD1.

The rise in the voltage levels at the points Gi due to ohmic drop through the resistances RGi is not harmful for the active elements of the chip.

However, if an electrostatic discharge occurs between the power supply pin VDD and an input-output pin I/O, for example, close to the power supply pin VDD (I/O on the left in FIG. 2), instead of travelling through the direct metal line VDDBUS to the ground pin GND and then through the ground distribution tree GNDTR to reach the input-output pin I/O via the third electrostatic discharge clipping device ESD3, the discharge current travels directly through the ground distribution tree between the power supply pin VDD and the input-output pin I/O via the second and third discharge clipping devices ESD2, ESD3.

This avoids combining the resistances Rbus, RGi($0 \le i \le n-1$) and Rg' of the metal tracks through which the discharge current flows and thus avoids the voltage level on the power supply pin from being excessively increased through ohmic drop due to the combination of the resistances Rbus, RGi ($0 \le i \le n-1$) and Rg'.

Specifically, in the absence of the second clipping device ESD2, the increase in the voltages that would be caused by ohmic drop across the resistances Rbus, RGi($0 \le i \le n-1$) and Rg' would be passed on to the ground pin GND and, through the first discharge clipping device ESD1, to the input terminal NE that is connected to the power supply distribution tree VDDTR.

However, the second discharge clipping device ESD2 and said at least a third discharge clipping device ESD3 allow the discharge current to travel through a more direct resistive pathway between the power supply pin VDD and the input-output pin I/O, i.e. only through Rg', thereby causing no increase in the voltages through ohmic drop in the power supply distribution tree VDDTR.

The device ESD for protection from electrostatic discharges does not require the metal line of the second power supply rail VDDBUS to exhibit very low resistivity, and the metal line may be as small as the design rules allow, taking into account in particular the maximum admissible current density restrictions during a discharge and in normal operation.

Because of the simplicity of the structure of the protection device ESD, the behavior of the device is readily foreseeable and it may thus easily be designed optimally.

In other words, what has been presented is a dual power supply rail structure, one rail acting as a standard power supply tree and the other carrying only the electrostatic discharge current and not being connected to any active element.

The structure makes it possible to predictably avoid the risk of poor performance in protecting integrated circuits from electrostatic discharges due to malfunctions caused by the resistivity of the power supply rails locally introducing overvoltages into the active elements.

The structure allows the power supply rails to be sized solely on the basis of the normal operating requirements of the integrated circuit rather than on the basis of minimizing the voltage drop during electrostatic discharges. This makes it possible to avoid consuming silicon area or implementing a more expensive process for protection from electrostatic discharges.

The invention claimed is:

1. An integrated circuit, including:
   a first power supply rail that is configured to distribute a supply voltage to active elements of the integrated circuit; and
   a device for protection from electrostatic discharges comprising:
      a second power supply rail that is configured to channel an electrostatic discharge current between a power supply pin and an input terminal, the second power supply rail not being connected to any active element of the circuit along its length between the power supply pin and the input terminal; and a first electrostatic discharge clipping device having a first node connected to the input terminal and a second node connected to a ground pin;

wherein the first power supply rail is directly electrically connected to the second power supply rail at said input terminal.

2. The integrated circuit according to claim 1, wherein the first electrostatic discharge clipping device further has a reference terminal at the second node that is directly electrically connected to the ground pin.

3. The integrated circuit according to claim 1, wherein the second power supply rail is connected at a first end to the power supply pin and connected at a second end to said input terminal.

4. The integrated circuit according to claim 1, further including a ground distribution tree, connected to the ground pin, that is configured to distribute a ground voltage to active elements of the integrated circuit, wherein the device for protection from electrostatic discharges comprises a second electrostatic discharge clipping device that is directly connected to the power supply pin and to a point on the ground distribution tree.

5. The integrated circuit according to claim 4, further including at least one input-output pin, wherein the device for protection from electrostatic discharges comprises at least a third electrostatic discharge clipping device that is directly connected, respectively, to each input-output pin and to a further respective point on the ground distribution tree.

6. The integrated circuit according to claim 1, further comprising:

an integrated circuit chip produced on a semiconductor substrate and incorporating active elements of the circuit; and an interconnect portion comprising metal levels incorporating said power supply rails and said power supply and ground pins.

7. An integrated circuit, including:

active circuit components;

a power supply pin;

a ground pin;

a first power supply rail having a first end directly electrically connected to the power supply pin and a second end, wherein the first power supply rail does not have distribution tree couplings for making power supply connections to any active circuit component;

a second power supply rail having a first end directly electrically connected to the second end of the first power supply rail at a node, wherein the second power supply rail has distribution tree couplings for making power supply connections to active circuit components;

a ground rail directly connected to the ground pin, wherein the ground rail has distribution tree couplings for making power supply connections to active circuit components;

a first electrostatic discharge clipping device having a first terminal directly electrically connected to said node and a second terminal directly electrically connected to the ground rail; and a second electrostatic discharge clipping device having a first terminal directly electrically connected to said power supply pin and a second terminal directly electrically connected to the ground rail.

8. The integrated circuit according to claim 7, further comprising:

an input/output pin; and a third electrostatic discharge clipping device having a first terminal directly connected to said input/output pin and a second terminal directly connected to the ground rail.

* * * * *